United States Patent
Oh

(10) Patent No.: US 10,186,483 B2
(45) Date of Patent: Jan. 22, 2019

(54) FUSE STRUCTURE AND METHOD OF MANUFACTURING THE SAME

(71) Applicant: SK hynix Inc., Gyeonggi-do (KR)

(72) Inventor: Dong Yean Oh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/947,211

(22) Filed: Apr. 6, 2018

(65) Prior Publication Data

US 2018/0226344 A1 Aug. 9, 2018

Related U.S. Application Data

(63) Continuation of application No. 15/473,837, filed on Mar. 30, 2017, now Pat. No. 9,978,679.

(30) Foreign Application Priority Data

Sep. 19, 2016 (KR) ........................ 10-2016-0119543

(51) Int. Cl.
*H01L 23/525* (2006.01)
*H01H 85/08* (2006.01)
*H01H 85/48* (2006.01)

(52) U.S. Cl.
CPC ......... *H01L 23/5256* (2013.01); *H01H 85/08* (2013.01); *H01H 85/48* (2013.01)

(58) Field of Classification Search
CPC ..... H01L 23/5256; H01H 85/08; H01H 85/48
See application file for complete search history.

(56) References Cited

U.S. PATENT DOCUMENTS 9,978,679 B2    5/2018  Oh
2009/0021338 A1 *  1/2009  Kim ...................... G11C 17/16
                                                     337/227

\* cited by examiner

*Primary Examiner* — Anthony Ho
(74) *Attorney, Agent, or Firm* — IP & T Group LLP

(57) ABSTRACT

A fuse structure may include an anode pattern, a cathode pattern and a connection member. The anode pattern may be formed on a semiconductor substrate. The cathode pattern may be formed on the anode pattern. The connection member may be electrically connected between the anode pattern and the cathode pattern. The connection member may have different widths.

14 Claims, 13 Drawing Sheets

__US 10,186,483 B2__

FUSE STRUCTURE AND METHOD OF MANUFACTURING THE SAME

CROSS-REFERENCES TO RELATED APPLICATION

This application is a continuation of U.S. patent application Ser. No. 15/473,837 filed on Mar. 30, 2017, which claims priority under 35 U.S.C. § 119(a) to Korean patent application number 10-2016-0119543, filed on Sep. 19, 2016, in the Korean Intellectual Property Office (KIPO). The disclosure of each of the foregoing applications is herein incorporated by reference in its entirety.

BACKGROUND

1. Technical Field

Various embodiments generally relate to a semiconductor device and a method of manufacturing the same, more particularly, to a three-dimensional fuse structure and a method of manufacturing the same.

2. Related Art

A fuse may be widely used in a semiconductor technology field such as a logic device, a memory device, etc. For example, in a memory device, a fuse may be used as an element for replacing a failed cell. Further, the fuse may be used as an identifying medium on a wafer.

The fuse may be classified into a laser fuse and an e-fuse in accordance with program types. A laser fuse may be selectively programmed, i.e., cut, using a laser. The e-fuse may be selectively programmed using a current or a voltage.

The e-fuse may not require expensive equipment because the e-fuse may be programmed by applying a current-voltage. The e-fuse may be configured to store information by voltages in accordance with electromigration or rupture generated by applying a voltage to a conductive layer such as a silicide/polysilicon layer.

When the voltage may be applied for the rupture, a heat may be generated from the fuse. The heat may act as a latent heat in the fuse. The latent heat may have an influence on an adjacent fuse to generate an undesired rupture.

SUMMARY

According to an embodiment of the present invention, there is provided an improved fuse structure including an anode pattern, a cathode pattern and a connection member.

In an embodiment, the anode pattern may be formed on a semiconductor substrate. The cathode pattern may be formed on the anode pattern. The connection member may be electrically connected between the anode pattern and the cathode pattern. The connection member may have different widths.

According to example embodiments, there may be provided a method of manufacturing a fuse structure. In the method of manufacturing the fuse structure, an anode pattern may be formed on a semiconductor substrate. A plurality of insulating layers may be formed on the anode pattern. A via hole may be formed through the insulating layers. The via hole may have a normal diameter region and an expanded diameter region. The via hole may be filled with a conductive layer to form a cathode pattern having a connection member. A void may be formed in the connection member corresponding to the expanded diameter region.

According to example embodiments, there may be provided a method of manufacturing a fuse structure. In the method of manufacturing the fuse structure, an anode pattern may be formed on a semiconductor substrate. A plurality of insulating layers may be formed on the anode pattern. A via hole may be formed through the insulating layers. The via hole may have a normal diameter region and a reduced diameter region. The via hole may be filled with a conductive layer to form a cathode pattern having a connection member. The connection member corresponding to the reduced diameter region may be used as a rupture target.

BRIEF DESCRIPTION OF THE DRAWINGS

Exemplary embodiments will be described with reference to the accompanying drawings.

FIGS. 1 to 5 are cross-sectional views and a perspective view illustrating a method of manufacturing a fuse structure in accordance with exemplary embodiments;

FIGS. 6 to 10 are cross-sectional views and a perspective view illustrating a method of manufacturing a fuse structure in accordance with exemplary embodiments;

FIGS. 11 to 14 are cross-sectional views and a perspective view illustrating a method of manufacturing a fuse structure in accordance with exemplary embodiments;

FIGS. 15 to 18 are cross-sectional views and a perspective view illustrating a method of manufacturing a fuse structure in accordance with exemplary embodiments;

FIGS. 19 to 22 are cross-sectional views and a perspective view illustrating a method of manufacturing a fuse structure in accordance with exemplary embodiments; and FIGS. 23 to 26 are cross-sectional views and a perspective view illustrating a method of manufacturing a fuse structure in accordance with exemplary embodiments.

DETAILED DESCRIPTION

Figure 1:
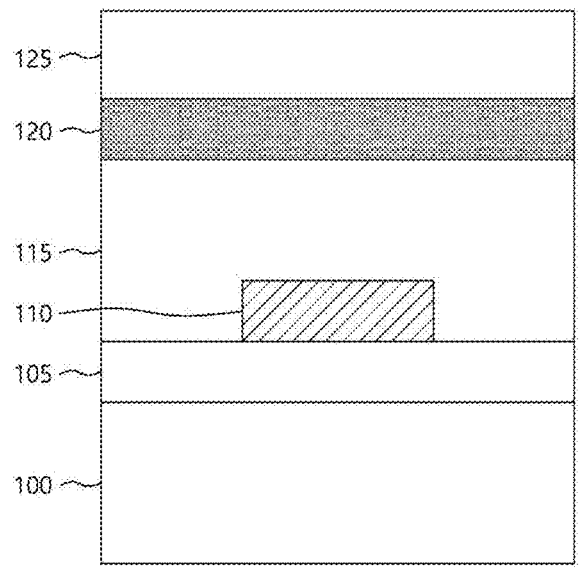
FIGS. 1 to 26 illustrate non-limiting examples and embodiments.

Various exemplary embodiments will be described more fully hereinafter with reference to the accompanying drawings, in which some embodiments are shown. The present invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that terms such as first, second, and third may be used herein to describe various elements, components, regions, layers and/or sections, and these elements, components, regions, layers and/or sections should not be limited by these terms. These terms are only used to distinguish one element, component, region, layer or section from another element, component, region, layer or section.

Spatially relative terms, such as "beneath," "below," "lower," "above," "upper" and the like may be used herein to describe the relationship between element(s) or feature(s) as illustrated in the figures. It will be understood that the spatially relative terms provided herein is exemplary and may have different orientations from the orientation depicted herein. For example, in a situation where the device shown in the given figures is turned over, elements described as "below" or "beneath" other elements or features would then be placed "over" or "above" the other elements or features. Thus, the exemplary term "below" may indicate either "above" or "below." The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises/includes" and/or "comprising/including" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations. Variations in shapes, in manufacturing techniques, and/or in tolerances are expected. Thus, embodiments should not be construed as limited to the particular shapes of regions illustrated herein. For example, even though illustrated as a rectangle, an implanted region may be rounded or curved. In addition, implant concentration may be different depending on locations.

Unless otherwise defined, all terms including technical and scientific terms, used herein have the same meaning as commonly understood by one of ordinary skill in the art to which this invention belongs in view of the present disclosure. It will be further understood that terms, such as those defined in commonly used dictionaries, should be interpreted as having a meaning that is consistent with their meaning in the context of the relevant art and the present disclosure.

Hereinafter, exemplary embodiments will be described in detail with reference to the accompanying drawings.

FIGS. 1 to 5 are cross-sectional views and a perspective view illustrating a method of manufacturing a fuse structure in accordance with exemplary embodiments.

Referring to FIG. 1, an underlayer 105 may be formed on an upper surface of a semiconductor substrate 100. The underlayer 105 may include a plurality of semiconductor circuit layers (not shown) and insulating layers (not shown). An anode pattern 110, which is a part of a fuse structure, may be formed on an upper surface of the underlayer 105. The anode pattern 110 may be formed by depositing a metal layer and by patterning the metal layer. In an exemplary embodiment, the anode pattern 110 may denote a first electrode.

A first insulating layer 115, a second insulating layer 120 and a third insulating layer 125 may be sequentially formed on the underlayer 105 with the anode pattern 110. For example, the second insulating layer 120 may have an etching selectivity substantially the same as that of the first and third insulating layers 115 and 125 with respect to a first etchant. The second insulating layer 120 may include a material having an etching selectivity faster than that of materials in the first and third insulating layers 115 and 125 with respect to a second etchant. The first to third insulating layers 115, 120 and 125 may have the same etching selectivity or different etching selectivities with respect to the first and second etchants. The second insulating layer 120 may have a thickness that is thinner than the thicknesses of the first and third insulating layers 115 and 125. In an embodiment, the first and third insulating layers 115 and 125 may be or include a silicon oxide and the second insulating layer 120 may be or include a silicon nitride.

Figure 2:
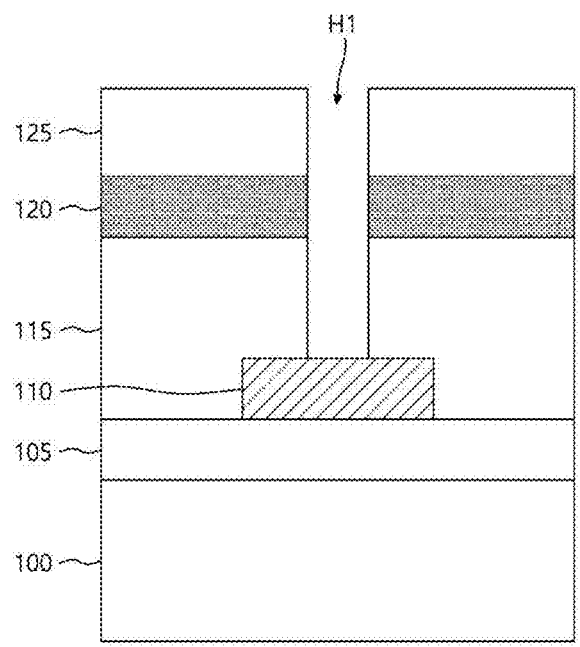

Referring to FIG. 2, the first to third insulating layers 115, 120 and 125 may be anisotropically etched using a first etchant having the same etching selectivity with respect to the first to third insulating layers 115, 120 and 125 to form a preliminary hole H1 that vertically pass through the first to third insulating layers 115, 120 and 125 and exposes a portion of an upper surface of the anode pattern 110.

Figure 3:
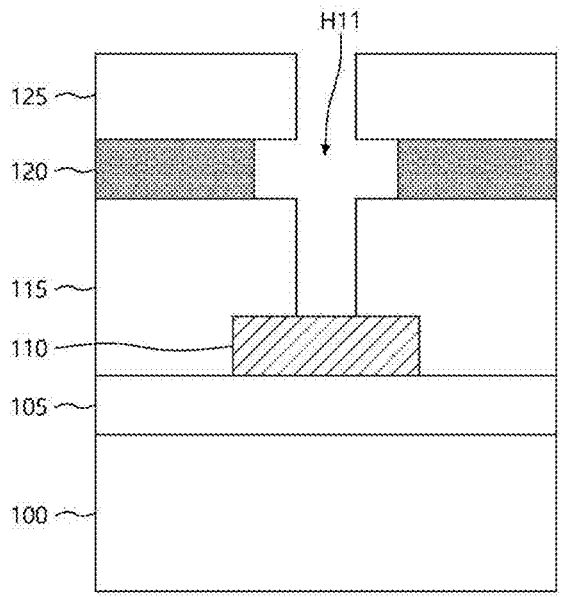

Referring to FIG. 3, the second insulating layer 120 may be etched using the second etchant having an etching selectivity with respect to the second insulating layer 120 faster than the first and third insulating layers 115 and 125 to form a via hole H11. A portion of the via hole H11 which is formed in the second insulating layer 120 may have a diameter greater than that of the via hole H11 in the first and third insulating layers 115 and 125 thus forming a cross-shape via hole H11. An upper surface of the first insulating layer 115 and a bottom surface of the third insulating layer 125 may be partially exposed by a portion of the via hole H11 that is formed in the second insulating layer 120.

Figure 4:
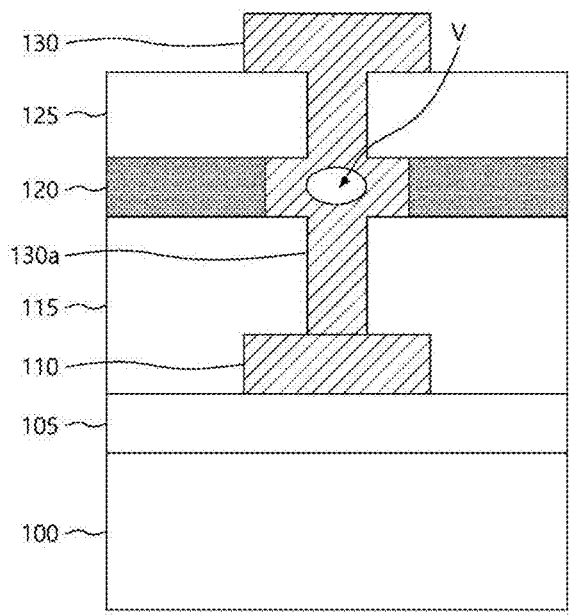

Referring to FIG. 4, a conductive layer may be formed on an upper surface of the third insulating layer 125 to fill up the via hole H11 (see the FIG. 3). The conductive layer may be patterned to form a cathode pattern 130. During forming of the conductive layer, cross shape via hole H11 of FIG. 3, is filled with the conductive material to form a connection member between the cathode pattern 130 and the anode pattern 110, except for a void V that may be generated in a central area of the via hole H11 in the second insulating layer due to the shape of the via hole H11 having a wider diameter at the second insulating layer level. Hence, the void V may be generated in the horizontal part of the cross shape via H11 in the second insulating layer 120. The void V may function as a rupture region of the fuse structure. A reference numeral 130a indicates the cross shape connection member between the anode pattern 110 and the cathode pattern 130.

Figure 5:
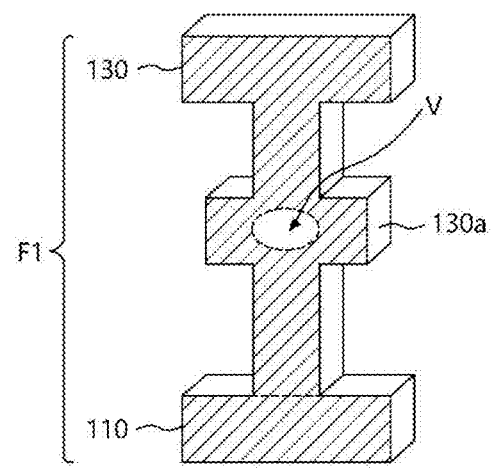

Referring to FIG. 5, a perspective view of a fuse structure F1 which is formed using the manufacturing method as described above with reference to FIGS. 1-4 is provided. The fuse structure F1, according to the embodiment of FIG. 5, may include the anode pattern 110, the cathode pattern 130 and the connection member 130a. The anode and cathode patterns may be parallel elongated members extending in a horizontal direction. The connection member 130a may have a cross shape and may be vertically extended from an upper surface of the anode pattern 110 to a lower surface of the cathode pattern 130. The connection member 130a is configured to connect the anode pattern 110 with the cathode pattern 130. Thus, the fuse structure F1 may have a three-dimensional structure having a substantially "I" shape. In an exemplary embodiment, the cathode pattern 130 may denote a second electrode.

According to example embodiments, the void V may be formed in the connection member 130a. The void V may be vulnerable to a current and a voltage. Because of the void V of the fuse structure F1 a rupture operation may be performed by applying a current or a voltage that have a lower level than a rupture current or a rupture voltage required for a conventional fuse. As a result, problems of the prior art caused by a high current may be suppressed. Further, an area of a power driver in which the fuse structure may be arranged may be decreased.

FIGS. 6 to 10 are cross-sectional views and a perspective view illustrating a method of manufacturing a fuse structure in accordance with exemplary embodiments.

Figure 6:
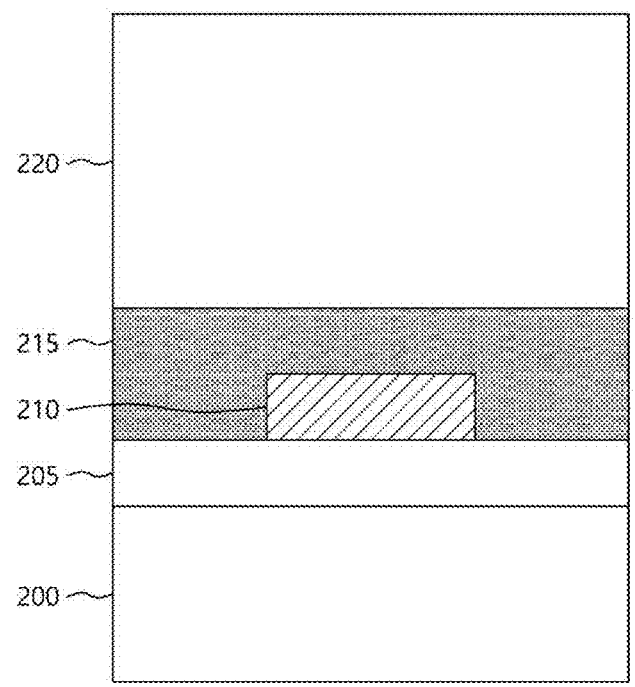

Referring to FIG. 6, an underlayer 205 may be formed on an upper surface of a semiconductor substrate 200. The underlayer 205 may include a plurality of semiconductor circuit layers (not shown) and insulating layers (not shown).

An anode pattern 210, which is a part of a fuse structure, may be formed on an upper surface of the underlayer 205.

A first insulating layer 215 and a second insulating layer 220 may be sequentially formed on the underlayer 205 with the anode pattern 210. The first and second insulating layers 215 and 220 may have a substantially the same etching selectivity with respect to a first etchant. Further, the first and second insulating layers 215 and 220 may have different etching selectivities with respect to a second etchant. The first insulating layer 215 may have a thickness thinner than that of the second insulating layer 220.

Figure 7:
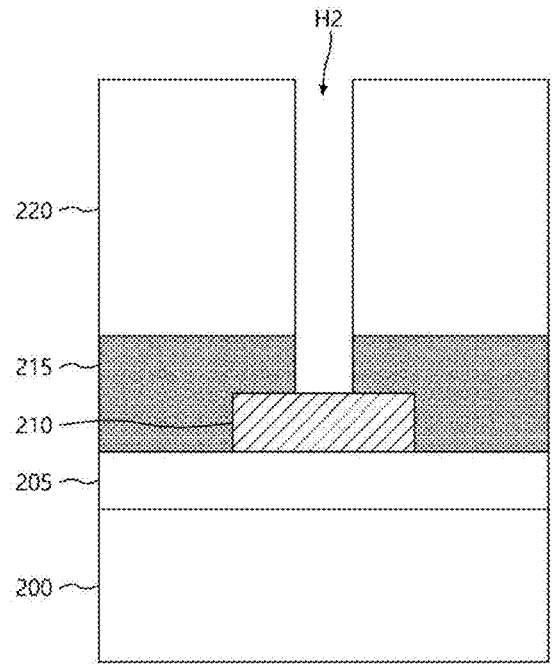

Referring to FIG. 7, the first and second insulating layers 215 and 220 may be anisotropically etched using the first etchant having the same etching selectivity to form a preliminary hole H2 that penetrates the first and second insulating layers and exposes the anode pattern 210.

Figure 8:
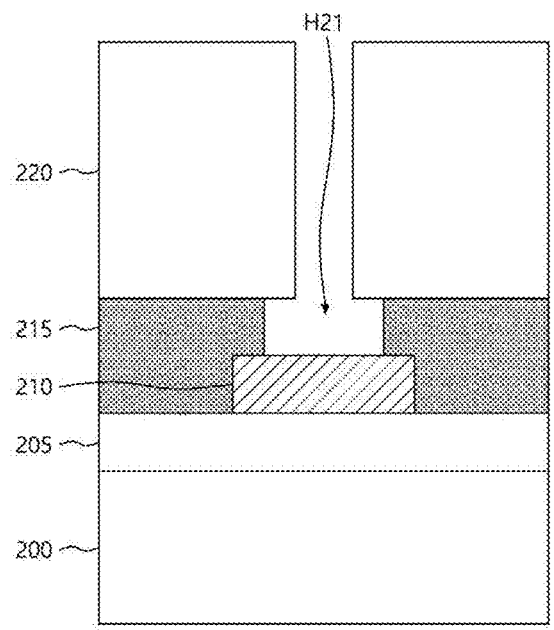

Referring to FIG. 8, an etching process using the second etchant having the different etching selectivities with respect to the first and second insulating layers 215 and 220 to form a via hole H21 having an upper part that is formed within the second insulating layer having a diameter (upper part diameter) and a lower part that is formed within the first insulating layer having a diameter (lower part diameter) that is greater than the upper part diameter.

Figure 9:
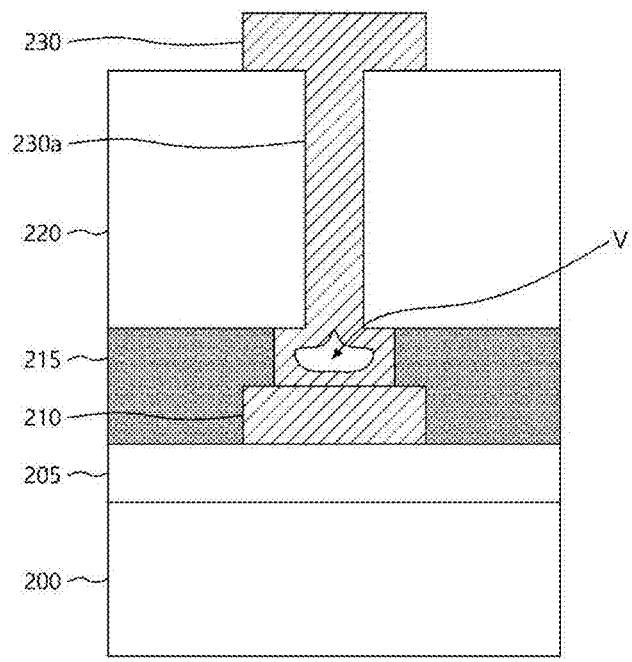

Referring to FIG. 9, a conductive layer may be formed on an upper surface of the second insulating layer 220 and may also fill up the via hole H21. The conductive layer may be patterned to form a cathode pattern 230. During forming of the conductive layer, as the via hole H21 is filled with the conductive material a void V is generated in the lower part of the via hole H21 which has the larger diameter due to the shape of the via hole H21 having different upper part and lower part diameters. The void V may cause a leakage current. Further, the void V may cause a rupture of the cathode pattern 230. A reference numeral 230a indicates a connection member for electrically connecting the cathode pattern 230 to the anode pattern 210.

Figure 10:
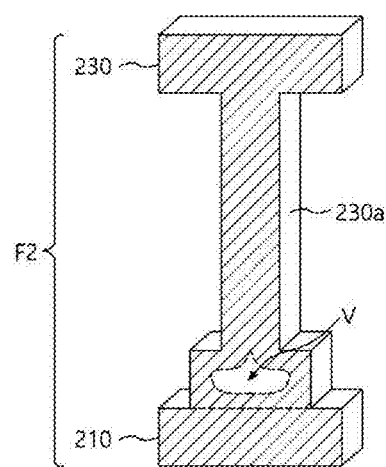

Referring to FIG. 10, a fuse structure F2 formed using the manufacturing method of FIGS. 6-9 may include the anode pattern 210, the cathode pattern 230 and the connection member 230a. The connection member 230a may be vertically extended from an upper surface of the anode pattern 200. The connection member 230a may be configured to connect the anode pattern 210 with the cathode pattern 230. Thus, the fuse structure F2 may have a three-dimensional structure having a substantially "I" shape. According to the embodiment of FIG. 10, the void V may be formed under the connection member 230a in a lower part of the connection member 230a that is adjacent to the anode pattern 210. Therefore, a rupture operation may be performed by applying a current or a voltage having a lower level than a rupture current or a rupture voltage of a conventional fuse by using the void V as a rupture target. As a result, problems of the prior art caused by a high current may be suppressed. Further, an area of a power driver in which the fuse structure may be arranged may be decreased.

FIGS. 11 to 14 are cross-sectional views and a perspective view illustrating a method of manufacturing a fuse structure in accordance with exemplary embodiments.

Figure 11:
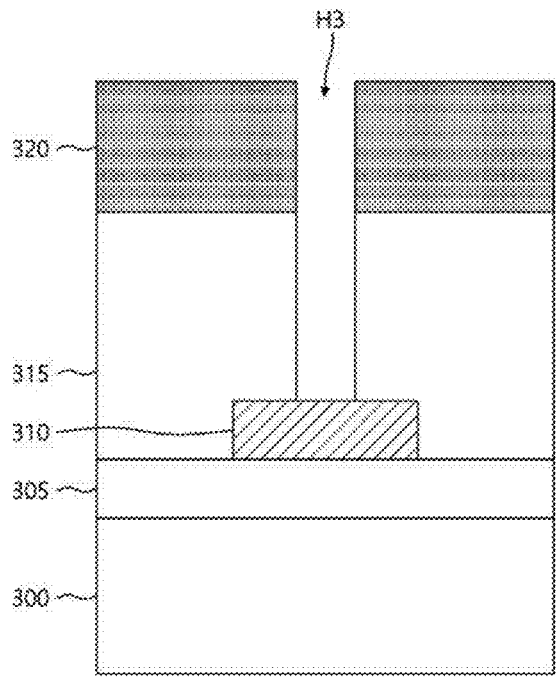

Referring to FIG. 11, an anode pattern 310 may be formed on an upper surface of a semiconductor substrate 300 with an underlayer 305.

A first insulating layer 315 and a second insulating layer 320 may be sequentially formed on the underlayer 305 with the anode pattern 310. The first and second insulating layers 315 and 320 may have substantially the same etching selectivity with respect to a first etchant. Further, the first and second insulating layers 315 and 320 may have different etching selectivities with respect to a second etchant. The first insulating layer 315 may have a thickness thicker than that of the second insulating layer 320.

The first and second insulating layers 315 and 320 may be anisotropically etched using the first etchant having the same etching selectivity to form a preliminary hole H3 which penetrates the first and second insulating layers 315 and 320 and exposes a portion of the upper surface of the anode pattern 310.

Figure 12:
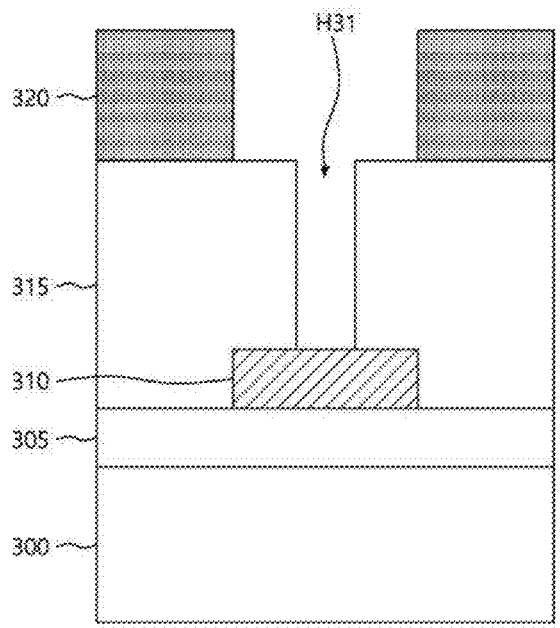

Referring to FIG. 12, an etching process using the second etchant having the different etching selectivities with respect to the first and second insulating layers 315 and 320 to form a via hole H31 having an upper part having an upper part diameter and a lower part having a lower part diameter that is smaller than the upper part diameter.

Figure 13:
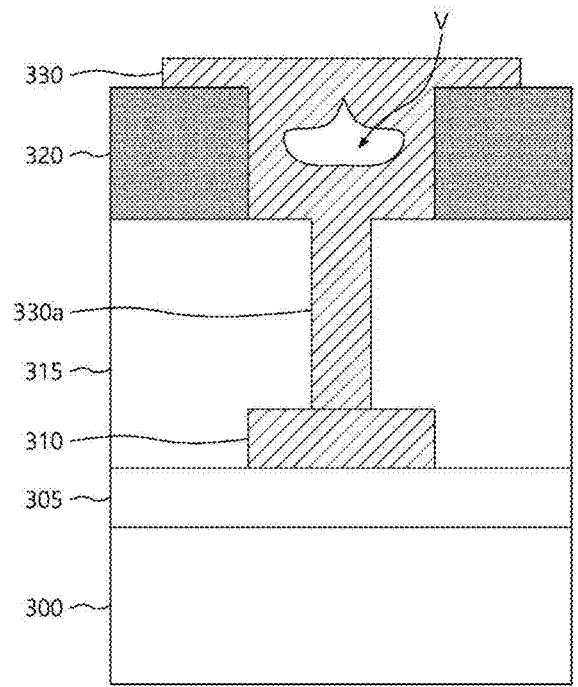

Referring to FIG. 13, a conductive layer may be formed on an upper surface of the second insulating layer 320 and also fill up the via hole H31. The conductive layer may be patterned to form a cathode pattern 330. During forming the conductive layer, an overhang may be generated in the upper part of the via hole H31. Thus, a void V may be generated in the upper portion of the via hole H31 where the overhang is generated. A reference numeral 330a indicates a connection member for electrically connecting the cathode pattern 330 to the anode pattern 310.

Figure 14:
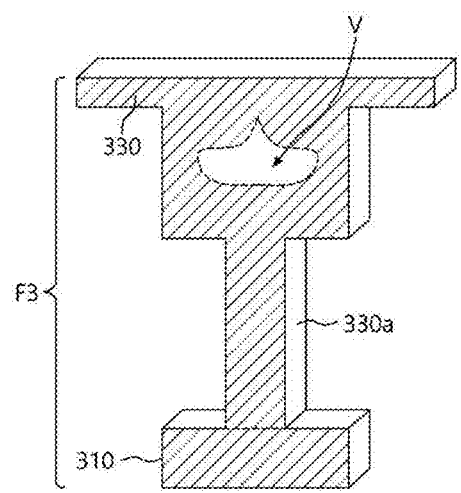

Referring to FIG. 14, the formed fuse structure F3 may include the anode pattern 310, the cathode pattern 330 and the connection member 330a. The connection member 330a may be vertically extended from an upper surface of the anode pattern 310. The connection member 330a may be configured to connect the anode pattern 310 with the cathode pattern 330. Thus, the fuse structure F3 may have a three-dimensional structure having a substantially "I" shape.

According to the embodiment of FIG. 14, the void V may be formed in the upper part (the overhang part) of the connection member 330a. Therefore, using the void V as a rupture target, a rupture operation may be performed by applying a current or a voltage having a lower level than a rupture current or a rupture voltage of a conventional fuse. As a result, problems of the prior art caused by a high current may be suppressed. Further, an area of a power driver in which the fuse structure may be arranged may be decreased.

FIGS. 15 to 18 are cross-sectional views and a perspective view illustrating a method of manufacturing a fuse structure in accordance with exemplary embodiments.

Figure 15:
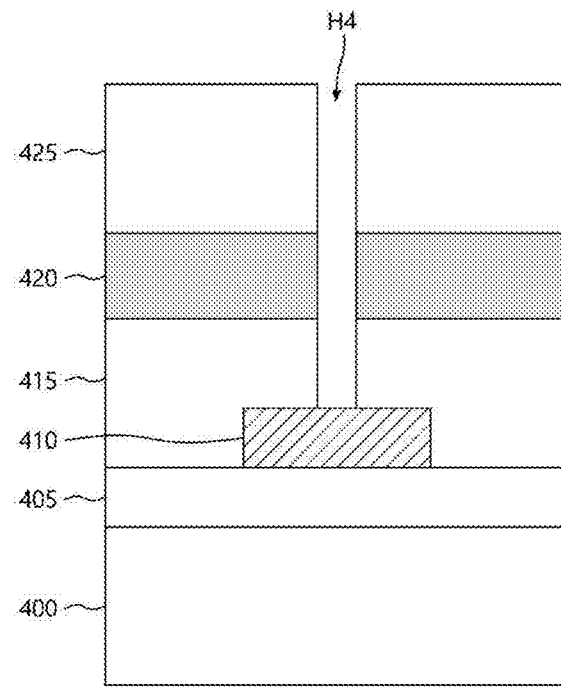

Referring to FIG. 15, an anode pattern 410 may be formed on an upper surface of a semiconductor substrate 400 with an underlayer 405.

A first insulating layer 415, a second insulating layer 420 and a third insulating layer 425 may be sequentially formed on the underlayer 405 with the anode pattern 410. The first to third insulating layers 415, 420 and 425 may include different materials. For example, the second insulating layer 420 may have an etching selectivity substantially the same as that of the first and third insulating layers 415 and 425 with respect to a first etchant. Further, the second insulating layer 420 may include a material having an etching selectivity slower than that of materials in the first and third insulating layers 415 and 425 with respect to a second etchant.

The first to third insulating layers 415, 420 and 425 may be anisotropically etched using the first etchant having the same etching selectivity to form a preliminary hole H4 configured to expose a portion of the upper surface of the anode pattern 410. The preliminary hole H4 may have a diameter smaller than a width of a target fuse.

Figure 16:
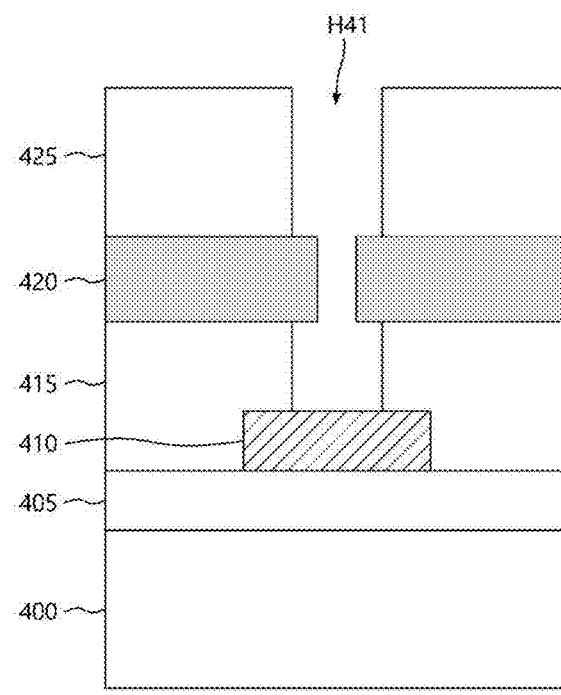

Referring to FIG. 16, an etching process using the second etchant having the different etching selectivities with respect to the first to third insulating layers 415, 420 and 425 to form a via hole H41. A diameter of a central portion of the via hole H41 formed in the second insulating layer may be smaller than the diameter of an upper and lower portions of the via hole H41.

Figure 17:
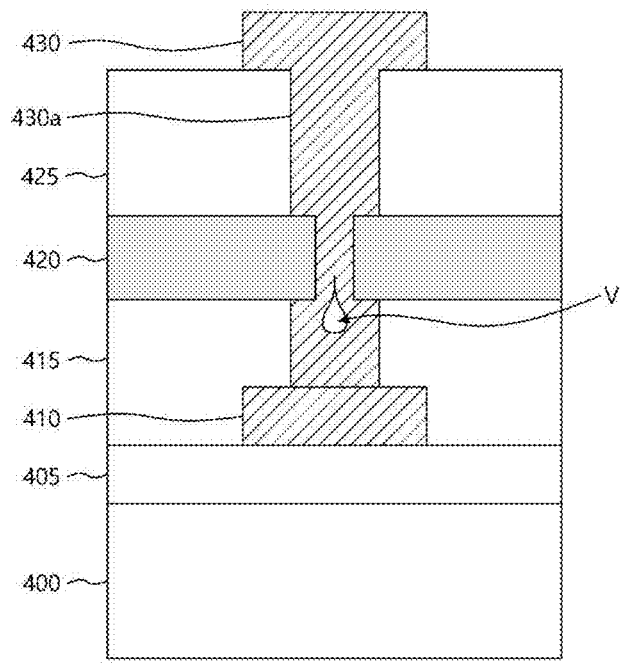

Referring to FIG. 17, a conductive layer may be formed on an upper surface of the third insulating layer 425 to fill up the via hole H41. The conductive layer may be patterned to form a cathode pattern 430. During forming the conductive layer, a void V may be generated in a portion of the via hole 430 adjacent to a boundary between the first insulating layer 415 and the second insulating layer 420. A reference numeral 430a indicates a connection member for electrically connecting the cathode pattern 430 to the anode pattern 410.

Figure 18:
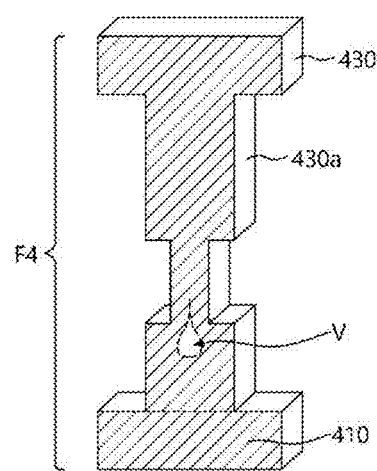

Referring to FIG. 18, the fuse structure F4 that is formed may include the anode pattern 410, the cathode pattern 430 and the connection member 430a. The connection member 430a may be vertically extended from an upper surface of the anode pattern 400.

Thus, the fuse structure F4 may have a three-dimensional structure having a substantially "I" shape. Further, the central portion of the connection member 430a may have a width narrower than that of other portions so that a rupture operation may be performed by applying a current or a voltage having a lower level than a conventional rupture current or a conventional rupture voltage compared to other portions. Furthermore, because the void V may be generated in a portion of the connection member 420a, the rupture operation may be performed using relatively low current or the relatively low voltage using a void portion as a rupture target. As a result, problems caused by a high current may be suppressed. Further, an area of a power driver in which the fuse structure may be arranged may be decreased.

FIGS. 19 to 22 are cross-sectional views and a perspective view illustrating a method of manufacturing a fuse structure in accordance with exemplary embodiments.

Figure 19:
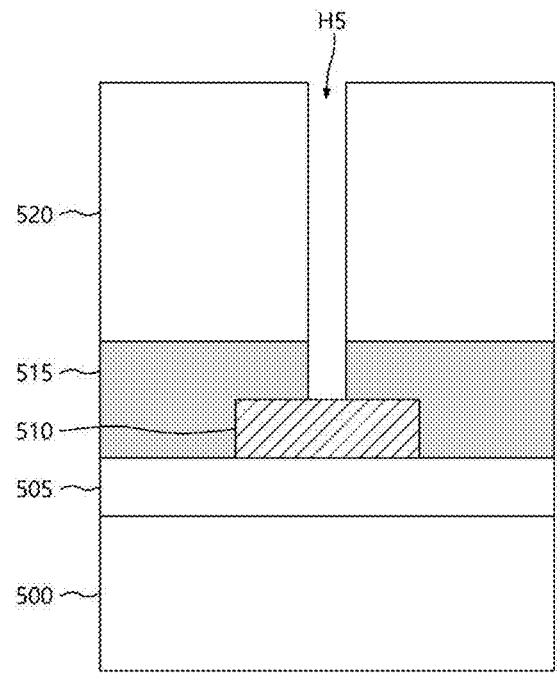

Referring to FIG. 19, an anode pattern 510 may be formed on an upper surface of a semiconductor substrate 500 with an underlayer 505.

A first insulating layer 515 and a second insulating layer 520 may be sequentially formed on the underlayer 505 with the anode pattern 510. The first and second insulating layers 515 and 520 may have a substantially same etching selectivity with respect to a first etchant. Further, the first and second insulating layers 515 and 520 may have different etching selectivities with respect to a second etchant. The first insulating layer 515 may have a thickness thinner than that of the second insulating layer 520.

The first and second insulating layers 515 and 520 may be anisotropically etched using the first etchant having the same etching selectivity to form a preliminary hole H5 configured to expose a portion of the upper surface of the anode pattern 510. The preliminary hole H5 may have a diameter less than a width of a target fuse.

Figure 20:
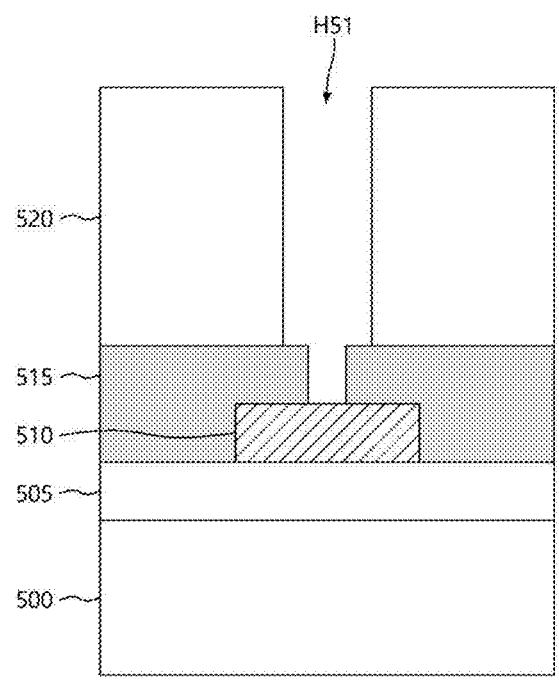

Referring to FIG. 20, an etching process using the second etchant having the different etching selectivities with respect to the first and second insulating layers 515 and 520 to form a via hole H51 having an upper part and a lower part with the lower part having a diameter that is smaller than the diameter of the upper part. For example, the upper diameter may be a diameter of the via hole H51 formed in the second insulating layer 520 and the lower diameter may be a diameter of the via hole H51 formed in the first insulating layer 515. The lower diameter may be a width of the target fuse.

Figure 21:
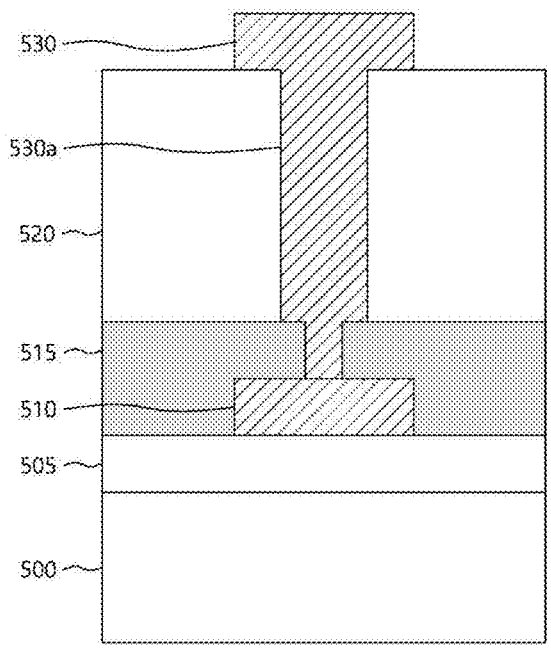

Referring to FIG. 21, a conductive layer may be formed on an upper surface of the second insulating layer 520 to fill up the via hole H51. The conductive layer may be patterned to form a cathode pattern 530. A reference numeral 530a indicates a connection member for electrically connecting the cathode pattern 530 to the anode pattern 510.

Figure 22:
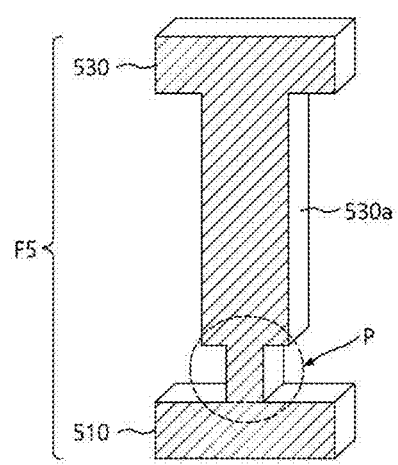

Referring to FIG. 22, the fuse structure F5 that is formed may include the anode pattern 510, the cathode pattern 530 and the connection member 530a. The connection member 530a may be vertically extended from an upper surface of the anode pattern 500.

Thus, the fuse structure F5 may have a three-dimensional structure having a substantially "I" shape. Further, the low portion P of the connection member 430a adjacent to the anode pattern 510 may have a width narrower than that of other portions of the connection member 430a so that a rupture operation may be performed by applying a current or a voltage having a lower level than a rupture current or a rupture voltage of a conventional fuse. That is, because the low portion P of the connection member 430a may act as a part of the void V, the rupture current may be decreased.

FIGS. 23 to 26 are cross-sectional views and a perspective view illustrating a method of manufacturing a fuse structure in accordance with exemplary embodiments.

Figure 23:
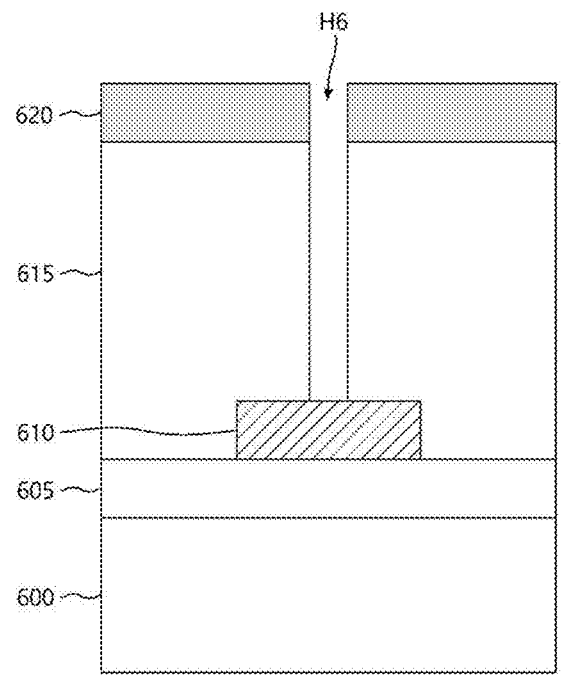

Referring to FIG. 23, an anode pattern 610 may be formed on an upper surface of a semiconductor substrate 600 with an underlayer 605.

A first insulating layer 615 and a second insulating layer 620 may be sequentially formed on the underlayer 605 with the anode pattern 610. The first and second insulating layers 615 and 620 may have substantially the same etching selectivity with respect to a first etchant. Further, the first and second insulating layers 615 and 620 may have different etching selectivities with respect to a second etchant. The first insulating layer 615 may have a thickness thicker than that of the second insulating layer 620.

The first and second insulating layers 615 and 620 may be anisotropically etched using the first etchant having the same etching selectivity to form a preliminary hole H6 configured to expose a portion of the upper surface of the anode pattern 610. The preliminary hole H6 may have a diameter less than a width of a target fuse.

Figure 24:
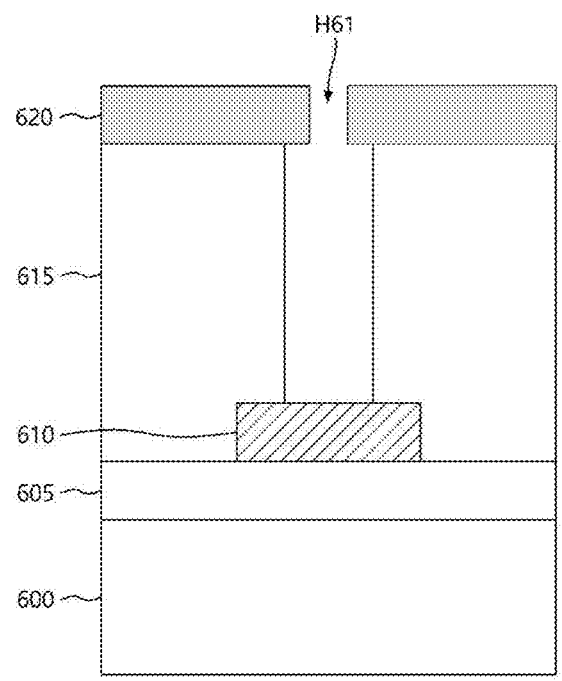

Referring to FIG. 24, an etching process using the second etchant having the different etching selectivities with respect to the first and second insulating layers 615 and 620 to form a via hole H61 having an upper part and a lower part with the diameter of the lower part being larger than the diameter of the upper part. The upper part of the via hole H61 may be formed in the second insulating layer 620 and the lower part of the via hole H61 may be formed in the first insulating layer 615. The lower part diameter may correspond to the width of the target fuse.

Figure 25:
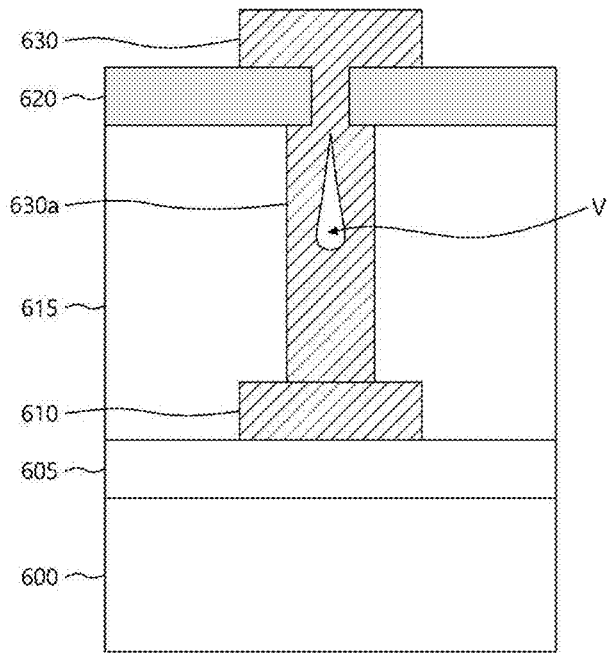
Figure 26:
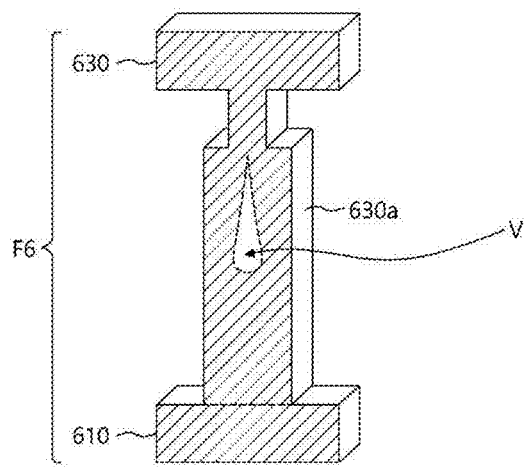

Referring to FIG. 25, a conductive layer may be formed on an upper surface of the second insulating layer 620 to fill up the via hole H61. The conductive layer may be patterned to form a cathode pattern 630. During forming the conductive layer, a void V may be generated in an upper portion of the lower part of the via hole H61. A reference numeral 630a indicates a connection member for electrically connecting the cathode pattern 630 to the anode pattern 610. Referring to FIG. 26, the fuse structure F6 may include the anode pattern 610, the cathode pattern 630 and the connection member 630a. The connection member 630a may be vertically extended from an upper surface of the anode pattern 600.

Thus, the fuse structure F6 may have a three-dimensional structure having a substantially "I" shape. The upper part of the connection member 630a adjacent to the cathode pattern 630 may have a width narrower than that of other portions. The void V may be generated in an upper portion of the lower part of the via hole H61. Thus, a rupture operation may be performed by applying a current or a voltage having a lower level than a rupture current or a rupture voltage. As a result, problems caused by a high current may be suppressed. Further, an area of a power driver in which the fuse structure may be arranged may be decreased.

According to example embodiments, the void may be formed by changing the shapes of the via hole during forming of the three-dimensional fuse structure. The positions of the void may also be changed. Therefore, the rupture current or the rupture voltage may be decreased. As a result, the area efficiency of the power driver in which the fuse structure may be arranged may be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a fuse structure, the method comprising:
   forming an anode pattern on an upper surface of a semiconductor substrate;
   forming a plurality of insulating layers;
   forming a via hole through the insulating layers, the via hole having a normal diameter region and an expanded diameter region; and
   forming a cathode pattern on the insulating layers and in the via hole, the cathode pattern including a connection member,
   wherein a void is formed in the connection member corresponding to the expanded diameter region.

2. The method of claim 1, wherein forming the insulating layers and forming the via hole comprise:
   sequentially forming a first insulating layer, a second insulating layer and a third insulating layer on the anode pattern;
   anisotropically etching the first to third insulating layers to form a preliminary hole configured to expose a portion of the upper surface of the anode pattern; and
   etching the second insulating layer to form the via hole having an expanded middle portion corresponding to the second insulating layer.

3. The method of claim 2, wherein the second insulating layer has a thickness thinner than a thickness of the first and third insulating layers.

4. The method of claim 1, wherein forming the insulating layers and forming the via hole comprise:
   sequentially forming a first insulating layer and a second insulating layer on the anode pattern;
   anisotropically etching the first and second insulating layers to form a preliminary hole configured to expose a portion of the upper surface of the anode pattern; and
   etching the first insulating layer to form the via hole having an expanded lower portion corresponding to the first insulating layer.

5. The method of claim 4, wherein the first insulating layer has a thickness thinner than a thickness of the second insulating layer.

6. The method of claim 1, wherein forming the insulating layers and forming the via hole comprise:
   sequentially forming a first insulating layer and a second insulating layer on the anode pattern;
   anisotropically etching the first and second insulating layers to form a preliminary hole configured to expose a portion of the upper surface of the anode pattern; and
   etching the first insulating layer to form the via hole having an expanded upper portion corresponding to the second insulating layer.

7. The method of claim 4, wherein the second insulating layer has a thickness thinner than a thickness of the first insulating layer.

8. A method of manufacturing a fuse structure, the method comprising:
   forming an anode pattern on an upper surface of a semiconductor substrate;
   forming a plurality of insulating layers;
   forming a via hole through the insulating layers, the via hole having a normal diameter region and a reduced diameter region; and
   forming a cathode pattern on the insulating layers and in the via hole, the cathode pattern including a connection member,
   wherein the connection member corresponding to the reduced diameter region is used as a rupture target.

9. The method of claim 8, wherein forming the insulating layers and forming the via hole comprise:
   sequentially forming a first insulating layer, a second insulating layer and a third insulating layer on the anode pattern;
   anisotropically etching the first to third insulating layers to form a preliminary hole configured to expose a portion of the upper surface of the anode pattern; and
   etching the first and third insulating layers to form the via hole having a reduced middle portion corresponding to the second insulating layer.

10. The method of claim 9, wherein the second insulating layer has a thickness thinner than a thickness of the first and third insulating layers.

11. The method of claim 8, wherein forming the insulating layers and forming the via hole comprise:
   sequentially forming a first insulating layer and a second insulating layer on the anode pattern;
   anisotropically etching the first and second insulating layers to form a preliminary hole configured to expose a portion of the upper surface of the anode pattern; and
   etching the second insulating layer to form the via hole having a reduced lower portion corresponding to the first insulating layer.

12. The method of claim 11, wherein the first insulating layer has a thickness thinner than a thickness of the second insulating layer.

13. The method of claim 8, wherein forming the insulating layers and forming the via hole comprise:
   sequentially forming a first insulating layer and a second insulating layer on the anode pattern;

anisotropically etching the first and second insulating layers to form a preliminary hole configured to expose a portion of the upper surface of the anode pattern; and etching the first insulating layer to form the via hole having a reduced upper portion corresponding to the second insulating layer.

14. The method of claim 13, wherein the second insulating layer has a thickness thinner than a thickness of the insulating layer.

* * * * *